LOCKED OSCILLATOR SYSTEMS

Filed Aug. 29, 1958

INVENTOR
WILLARD W. McLEOD, JR.
BY H. Vincent Harsha
ATTORNEY

United States Patent Office 3,127,572
Patented Mar. 31, 1964

3,127,572

LOCKED OSCILLATOR SYSTEMS

Willard W. McLeod, Jr., Lexington, Mass., assignor to Raytheon Company, Lexington, Mass., a corporation of Delaware Filed Aug. 29, 1958, Ser. No. 758,878
7 Claims. (Cl. 331—55)

This invention relates generally to oscillator systems and more particularly pertains to a stable oscillating system in which one oscillator, termed the locked or driven oscillator, is controlled by a second oscillator, designated the driving or locking oscillator, which determines the oscillatory frequency of the system.

The invention is particularly advantageous in any application where it is desired to control the characteristics of a high power oscillator with a low power oscillator. The novel system utilizes a ferrite circulator to isolate the high power locked oscillator from the low power locking oscillator and additional isolation is obtained by employing a series ferrite isolator. The high degree of isolation between the locked oscillator and the locking oscillator afforded by the system prevents reaction of the high power tube on the low power tube. Thus, power gains can be achieved in a manner closely analogous to that of a saturated amplifier. An important feature of the system is that almost the entire output of the high power oscillator is delivered directly to the utilization circuit or useful load. The only losses which occur are due mainly to imperfections in the circulator and at the present state of the circulator art those losses can be made extremely small. In an ideal system all the energy delivered to the load would be absorbed. In a practical system, however, variations in load impedance must be expected and its effect on an oscillator must be taken into consideration. It is known that variations in load impedance react on oscillators of the klystron, magnetron, and other types, tending to change their frequency of oscillation, and this phenomenon of frequency pulling of oscillators has been reported in the technical literature, e.g., "Microwave Electronics," by John C. Slater, published by D. Van Nostrand Co. Due to the arrangement of the novel system, reflection of energy by the load is not coupled back into the locked oscillator but instead is transmitted to an arm of the circulator where it is absorbed in a reflectionless termination. The useful load, insofar as the transmission of reflected energy is concerned, is effectively decoupled from the locked oscillator so that variations in the impedance of the load have no significant effect on the frequency of the oscillator.

In many pulse-to-pulse coherent doppler radars, it is highly desirable to have the starting phase of a high power microwave oscillation generator, such as a magnetron, synchronized with a lower power continuous wave (CW) master oscillator. The problem of injecting the signal from a low power master oscillator into a high power oscillator while simultaneously preventing the master oscillator from being pulled by the reaction of the high power oscillator has been extremely troublesome and until now has not been satisfactorily solved. In the past, directional couplers with their inherent loss and recoprocal attenuation characteristics have been used to isolate the two oscillators at a cost of reduced efficiency and poor performance. One embodiment of the invention relates to a system in which a high power pulsed magnetron oscillator is locked in phase to a low power reference klystron oscillator. The system can be employed to provide a transmitter with the high power capabilities and efficiency of a magnetron and the noise and modulation characteristics of a beam tube.

The nature of the present invention, together with its various features and advantages, can more readily be apprehended by perusal of the following detailed description when considered in conjunction with the illustrative embodiments shown by the accompanying drawings in which.

Figures 1, 2, 3, 4:
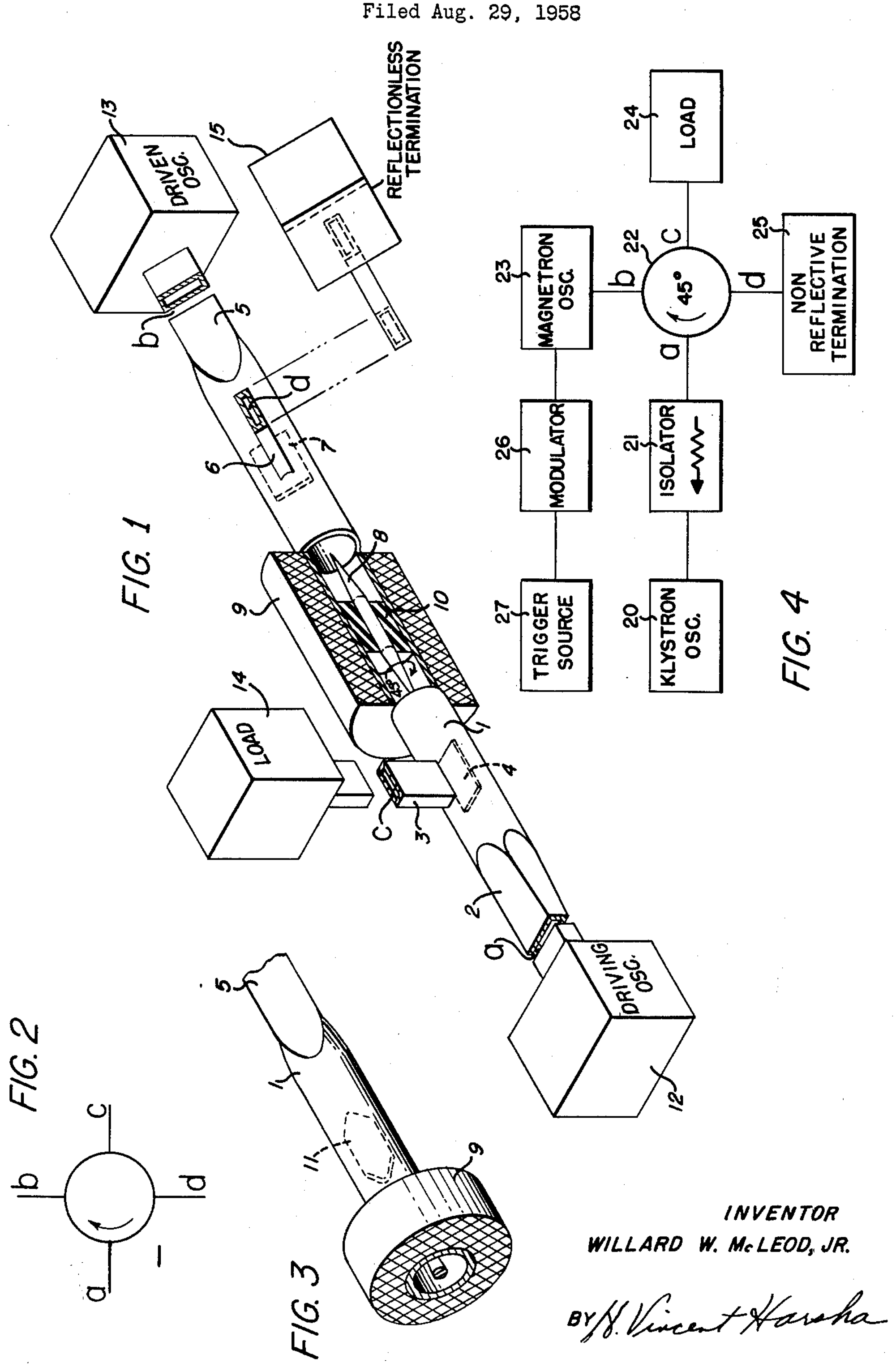
FIG. 1 is a perspective view of a simple locked oscillator system in accordance with the invention.
FIG. 2 is the conventional symbol used to represent a circulator.
FIG. 3 illustrates a modification of the circulator for converting that device to an isolator.
FIG. 4 is a schematic diagram of a phase-locked oscillator system in which the driven oscillator may be pulsed.

Referring now to FIG. 1, there is shown a locked oscillator system employing the nonreciprocal wave transmission properties of a ferrite circulator to couple the output of a master oscillator 12 to a driven oscillator 13 and to transmit the output of the driven oscillator 13, to a useful load 14 while causing energy reflected from the load to be absorbed in a reflectionless termination 15. The circulator permits wave energy from the master oscillator to be transmitted to the driven oscillator but prevents the output of the driven oscillator from disturbing the master oscillator. An understanding of the functioning of a circulator being requisite to the apprehension of the invention, a description of one type of circulator and its manner of operation will now be given. The circulator is, in essence, a four terminal wave-guide network and includes a circular wave guide 1 which tapers smoothly and gradually from its left-hand end into a rectangular wave guide 2. A second rectangular guide 3 is joined to the circular guide 1 in a shunt or H-plane junction adjacent the round to retangular transition. The rectangular wave guides 2 and 3 accept and support only plane waves in which the component of the electric vector, which determines the plane of polarization of the wave, is consistent with the dominant $TE_{10}$ mode in rectangular wave guide. Likewise, the dimension of circular guide 1 is preferably chosen so that only the dominant $TE_{11}$ mode in it can be propagated. By means of the smooth transition from the rectangular cross-section of guide 2 to the circular cross-section of guide 1, the $TE_{10}$ mode, viz., wave energy having a plane of polarization parallel to the narrow dimension of the rectangular cross-section of guide 2, may be coupled to and from the $TE_{11}$ mode in circular guide 1 which has a similar or parallel polarization. Any other polarization of wave energy in circular guide 1 will not pass through the polarization-selective terminal comprising rectangular guide 2. Guide 3 is physically oriented with respect to guides 1 and 2 so that the $TE_{10}$ mode in rectangular guide 3 is coupled by way of the shunt plane junction into the particular $TE_{11}$ mode in circular guide 1 which is polarized perpendicular to the $TE_{11}$ mode introduced by rectangular guide 2. Thus, guides 2 and 3 comprise a pair of polarization-selective connecting terminals by which wave energy in two orthogonal $TE_{11}$ mode polarizations may be coupled to and from one end of circular guide 1. Furthermore, these guides comprise a pair of conjugately related terminals or branches, inasmuch as a wave launched in one will not appear in the other.

In accordance with the preferred manner of constructing a circulator, a highly conductive reflecting vane 4, which may be in the order of one-half wavelength in length, is preferably diametrically disposed in circular guide 1 opposite the junction aperture of guide 3 to reflect those waves having their plane of polarization coincident with the plane of vane 4 into guide 3.

At the other end of guide 1 is a similar pair of polarization-selective conjugate terminals constituted by rectangular guides 5 and 6. These guides couple waves in guide 1 which are polarized in planes 45 degrees inclined to the planes of the corresponding waves, respectively, to which guides 2 and 3 are coupled. Thus, circular guide 1 tapers into a rectangular guide 5 which supports a wave polarized in a plane inclined 45 degrees with respect to the polarization of the wave in guide 2. Guide 1 is joined by a shunt plane junction to a second rectangular guide 6 which is perpendicular to both guides 1 and 5 and which accepts waves from guide 1 having a plane of polarization inclined at 45 degrees to the polarization of those waves accepted by guide 3. A highly conductive reflecting vane 7 is positioned adjacent the junction of guide 6 and bears the same relation thereto as vane 4 to the junction of guide 3.

Interposed between the first pair of conjugate terminals comprising guides 2 and 3 and the second pair of conjugate terminals comprising guides 5 and 6 in the path of wave energy passing therebetween in guide 1 is an element which produces an antireciprocal rotation of the plane of polarization of these electromagnetic waves, that is, a Faraday-effect element which causes an incident wave impressed upon a first side of the element to emerge from the second side polarized at a different angle from the original wave and an incident wave impressed upon the second side to emerge from the first side with an additional rotation of the same angle.

The polarization of a wave passing through the element first in one direction and then in the other undergoes two succesive space rotations or space phase shifts in the same sense, so that the total rotation undergone is twice that of a single passage. As illustrated by way of example in the drawing, the Faraday-effect element 8 is a right cylinder having conically tapered ends which provide impedance-matching transistions to the circular guide 1. The Faraday-effect element is mounted in a dielectric support 10 inside guide 1 approximately midway between the conjugate pairs of terminals. The supporting member 10 has a low dielectric constant and may be constructed from an aerated dielectric material such as polyfoam. Element 8 is constituted by magnetic material, for example a nickel-zinc ferrite having a thickness of the order of magnitude of a wavelength. This material has been found to operate satisfactorily as a directionally selective Faraday-effect rotator for polarized electromagnetic waves to an extent up to 90 degrees or more when placed in the presence of a longitudinal magnetizing field of adequate strength and is capable of transmitting elecmagnetic waves, for example in the centimeter range, with substantially negligible attenuation. Suitable means for producing the necessary longitudinal magnetic field surrounds element 24 and, for the purpose of illustration, a permanently magnetized structure 9 is shown mounted upon the outside of guide 1. It should be noted, however, that in lieu of using a permanent magnet, an electromagnet energized by a D.C. source may be employed. The angle of rotation of polarized electromagnetic waves in materials exhibiting Faraday rotation is approximately directly proportional to the thickness of the material traversed by the waves and to the intensity of the magnetization to which the material is subjected, and it is possible to adjust the amount of rotation by varying or properly choosing the thickness of the material comprising element 8 and the intensity of magnetization supplied by an electromagnet.

One theory attempting to explain the phenomenon involved in Faraday rotation holds that a plane polarized wave incident upon the Faraday-effect material in the presence of a magnetic field produces two sets of circularly polarized secondary waves in the material, the two sets of waves being circularly polarized in opposite senses and traveling through the medium at unequal speeds. Upon emerging from the material, the secondary waves in combination set up a plane polarized wave, which is in general polarized at a different angle from the original wave' It has been experimentally verified that Faraday rotation depends for its direction upon the direction of the magnetic field. Thus, if the direction of the magnetic field is reversed, the direction of the Faraday rotation is also reversed in space so that the original relationship of the direction of rotation to the direction of the magnetic field is retained.

The operation of the circular which forms a portion of the system shown in FIG. 1 may now be more readily explained. Thus, a vertically polarized wave introduced at terminal *a* into guide 2 travels past the aperture of guide 3 and its associated vane 4 unaffected thereby, inasmuch as the effective polarization of these components is perpendicular to the polarization of the wave, to element 8. The length of element 8 and the field intensity of magnet 9 are selected to cause a 45 degree rotation of the plane of polarization of the wave in a direction which is dependent on the direction of the magnetic field. Thus, in FIG. 1, the vertical polarization of the wave introduced at terminal *a* is rotated 45 degrees in a clockwise direction, indicated by the arrow on element 8 in the drawing, thereby bringing the plane of polarization of the wave into the preferred direction for transmission unaffected past guide 6 and into the proper polarization for passage through guide 5 to terminal *b*. Substantially free transmission is therefore afforded from terminal *a* to terminal *b*. Should the wave leaving terminal *b* be caused to reverse its direction, it will be transmitted unaffected past the conjugate guide 6 to element 8. This wave will be rotated 45 degrees by element 8 in the direction of the arrow thereon, bringing the wave into horizontal polarization at the aperture of guide 3 into which it will be reflected by vane 4 for passage out of terminal *c*. Should the wave leaving terminal *c* be caused to reverse its direction, it will be launched into guide 1 in a polarization conjugate to guide 2 and will travel to element 8. Element 8 again rotates the polarized wave 45 degrees in the direction of the arrow, bringing the wave into the proper polarization for passage by guide 6 to terminal *d*. Similarly, if the wave again be caused to reverse its direction, it will be launched in guide 1 with a polarization conjugate to guide 5 and will travel to element 8, where it receives a further 45 degree rotation in the direction of the arrow, bringing its plane of polarization into the proper direction for transmission through guide 2 to terminal *a*. However, it should be noted that on passage from terminal *d* to *a*, the wave leaving guide 2 is inverted because it has experienced a phase shift of 180 degrees with respect to the assumed initial polarization.

Considering the above-described transmission characteristics, the applicability of the term "circular" as a descriptive name for the non-reciprocal four terminal network of FIG. 1 and the relevance of the symbol in FIG. 2, which is the convention adopted to represent a circulator, are apparent. Introduction of waves into terminal *a* causes these waves to be transmitted to terminal *b*, transmission from *b* leads to terminal *c*, transmission from *c* leads to terminal *d*, and transmission from terminal *d* leads to terminal *a*. Each terminal is coupled around the circle to only one other terminal for a given direction of wave propagation, but to another terminal for the opposite direction of wave propagation.

Having thus analyzed the structure and characteristics of the circulator, consideration may be given to the circuit arrangement of FIG. 1. It is now apparent that the output of the master oscillator 12, which propagates into terminal *a*, is transmitted by the circulator to terminal *b* where it provides a locking signal for the driven oscillator 13. The output of driven oscillator 13 is coupled into terminal *b* and is, in turn, transmitted by the circulator to the terminal *c* and thence into the energy utilizing load 14, which may be an antenna, for example. Any energy reflected by the load into terminal *c* is transmitted to terminal *d* where the energy is absrbed in a reflectionless termination 15. In lieu of the wave guide 6 and its reflectionless termination 15, the circulator may be modified, as shown in FIG. 3, by replacing those members with a vane 11 of resistive material several wavelengths long, the vane being diametrically disposed in circular guide 1 in the plane of the wave energy to be dissipated. To prevent inordinate reflection of energy from the vane, the ends of the vane are preferably tapered to provide a gradual impedance transition. A perfectly constructed circulator affords excellent isolation for the driving oscillator 12, inasmuch as the nonreciprocal transmission properties of the circulator prohibit energy from the driven oscillator 13 from flowing directly back into the driving oscillator while freely permitting transmission in the opposite direction.

FIG. 4 illustrates a system in which a high power magnetron oscillator is locked to, and controlled by, a low power klystron. The system employs a device known as an isolator. The term "isolator" denotes a nonreciprocal wave transmission device which may be employed to transmit electromagnetic waves in one direction without substantial attenuation, designated the forward direction, but greatly attenuates waves traveling in the opposite direction, designated the reverse direction. Isolators of various types, employing ferrites, are described in "The Bell System Technical Journal," vol. 34, January 1955, pp. 1 to 103. The circulator shown in FIG. 1 may be changed to an isolator by providing terminals *c* and *d* with reflectionless terminations. Thus, energy entering terminal *a* will be transmitted to terminal *b*, but any energy entering at *b* will be absorbed in the terminations at *c* and *d*. In the system of FIG. 4 the klystron oscillator 20 has its output coupled to an isolator 21 which, in turn, is coupled to the arm *a* of circulator 22. The symbol ←∿∿∿— in the isolator box indicates absorption of power in an internal load where energy propagation is in the direction of the arrow and propagation with negligible absorption of power in the opposite direction. The output from the low-power klystron oscillator 20, therefore, is transmitted through the isolator into the arm *a* of the circulator with very little power loss. By virtue of the characteristics of a 45° circulator, nearly the entire power output of the klystron is delivered directly into the magnetron oscillator 23 coupled to the arm *b*. A magnetron oscillator is a device which commonly is provided only with an output coupling and no provisions are made for the insertion of an input signal. In the system illustrated in FIG. 4, the output coupling of the magnetron is secured to the arm *b* of the circulator, and power from the klystron is transmitted from the arm *a*, into the arm *b*, and into the magnetron through its output coupling. The output from the high power magnetron oscillator is transmitted from the arm *b* to the arm *c*, whence it is delivered to a utilization load 24 which may be an antenna, for example. Under ideal conditions the utilization device would constitute a matched load so that all the power proceeding into the arm *c* would be absorbed without reflections. However, a perfectly matched load is difficult to atttain in practice so that the reflection of some energy from the load 24 back into the arm *c* must be anticipated. Energy reflected from the load 24 into the arm *c* is transmitted to the arm *d* which is terminated by a non-reflective energy-absorbing means 25. The magnetron 23 may be continuously operated or it may be provided with a modulator 26 whereby the tube may be pulsed into operation upon the receipt of a triggering signal from a trigger source 27. The low power klystron oscillator 20 is preferably operated in continuous wave fashion so that when the magnetron is pulsed, it will be locked in phase to the klystron. Where the klystron is frequency modulated, the magnetron will closely follow the frequency deviations of the klystron. Thus the system can be employed to provide a high power FM transmitter.

Using a system of the type illustrated in FIG. 4, a series of experiments were undertaken to ascertain certain of the characteristics of the locked oscillator system. No special efforts were made to obtain optimum performance. A QK410 magnetron was used as the high power oscillator, and at an anode current setting of 240 milliamperes, its power output was 112 watts. A V23 two-cavity klystron having a power output of 6.6 watts was used as the low power oscillator. It was found that the magnetron would lock in to the frequency of the klystron over a ±5 megacycle range and that the magnetron remained locked even through its anode current was varied from 200 to 300 milliamperes. The FM (frequency modulated) noise of the magnetron, as measured on a discriminator, decreased by 11 db. when the magnetron was locked to the klystron and further reduction of FM noise was not feasible because the magnetron had been reduced to the FM noise level of the klystron itself. In order to determine the modulation characteristics of the system, the magnetron was locked to the klystron and the klystron was frequency modulated by plate pushing. At a 60 cycle rate, more than 2 megacycles of frequency modulation was obtained without difficulty. That is, the magnetron remained locked to the klystron although the klystron was being frequency modulated. These tests indicate that the invention can be employed to produce an oscillator system having the high power capability and efficiency of a magnetron and the noise and modulation characteristics of a beam tube. By the use of this system, high efficiency magnetrons can be used in many applications where formerly only lower efficiency klystrons were suitable.

This completes the description of the embodiment of the invention illustrated herein. However, modifications and advantages thereof will be apparent to persons skilled in the art without departing from the spirit and scope of this invention. Accordingly, it is desired that this invention not be limited to the particular details of the embodiment disclosed herein except as defined by the appended claims.

What is claimed is:

1. A system for locking together two oscillators comprising a driving oscillator, a driven oscillator, a utilization device, and a circulator having nonreciprocal wave transmission arms, means for introducing the output of said driving oscillator into a first one of said arms, substantially the entire output being directly transmitted to a second one of said arms, means securing said driven oscillator to said second arm, said circulator having a third arm for directly receiving the output of said driven oscillator, a utilizatioin device connected to said third arm, and means in said circular for absorbing energy reflected from said utilization device.

2. A system for locking together two oscillators comprising a driving oscillator, a driven oscillator, an isolator, a utilization device, a circulator having a plurality of nonreciprocal wave transmission arms, means coupling said driving oscillator to a first one of said arms through said isolator whereby wave energy from said driving oscillator is freely transmitted into said first arm, substantially the entire output of said driving oscillator being directly transmitted to a second one of said arms, means coupling said driven oscillator to said second arm, the output of said driven oscillator being directly transmitted to a third one of said arms, means coupling said utilization device to said third arm, and energy absorbing means in said circulator for absorbing energy reflected from said utilization device.

3. A system for locking a high power magnetron to a low power klystron comprising a circulator having a plurality of nonreciprocal wave transmission arms, an isolator connected to one of said arms for absorbing energy emerging therefrom, a klystron having its output coupled to said circulator through said isolator, substantially the entire output of said klystron being directly transmitted to a second one of said arms, a magnetron having its output coupling secured to said second arm of the circulator, a modulator connected to said magnetron, a trigger source coupled to said modulator whereby said magnetron may be pulsed into operation, the output of said magnetron being directly transmitted to a third one of said arms, a utilization device coupled to said third arm of said circulator, and energy absorbing means in said circulator for absorbing energy reflected from said utilization device.

4. A system for locking together two oscillators comprising a driving oscillator, a driven oscillator, a utilization device, and a circulator having four nonreciprocal wave transmission arms, means coupling said driving oscillator to a first one of said arms to introduce the output of said driving oscillator into said first arm and therewith directly transmit substantially the entire output to a second one of said arms, means operatively connecting said driven oscillator to said second arm, said utilization device being connected to the third arm of said circulator, and absorbing means operatively connected to the fourth arm of said circulator for absorbing energy reflected from said utilization device.

5. A system comprising: a signal synchronizing means; a synchronized means; a utilization means; a nonreciprocal ferrite coupling means for coupling substantially all the energy from said synchronizing means to said synchronized means and substantially all the energy from said synchronized means to said utilization means including means for preventing energy reflected from said utilization means from reaching said synchronizing means.

6. A system comprising: a driving means; a driven means; a utilization device; and nonreciprocal ferrite coupling means for coupling substantially all the energy from said driving means to said driven means and substantially all the energy from said driven means to said utilization device including means for preventing energy reflected from said utilization device from reaching said driving means whereby said driven means produces a signal, frequency and phase locked to said driving means.

7. A system comprising: a driving means; a driven means; pulsing means coupled to said driven means to cause said driven means to generate a signal during predetermined time intervals recurring in a predetermined pattern; a utilization device; and nonreciprocal ferrite coupling means for coupling substantially all the energy from said driving means to said driven means and substantially all the energy from said driven means to said utilization device including means for preventing energy reflected from said utilization device from reaching said driving means, thereby to establish phase coherence between the starting phase of each pulse of energy generated by the driven means.

References Cited in the file of this patent

UNITED STATES PATENTS

| | | |
|---|---|---|
| 2,565,112 | Altar | Aug. 21, 1951 |
| 2,748,352 | Miller | May 29, 1956 |
| 2,759,099 | Olive | Aug. 14, 1956 |
| 2,803,750 | Dayem | Aug. 20, 1957 |
| 3,003,118 | Kline | Oct. 3, 1961 |

FOREIGN PATENTS

| | | |
|---|---|---|
| 1,096,990 | France | June 28, 1955 |

OTHER REFERENCES

Ohm: "A Broad-Band Microwave Circulator," IRE Transaction on Microwaves Theory and Technique, October 1956, pages 210–217.